United States Patent
Li et al.

(10) Patent No.: US 9,689,087 B1
(45) Date of Patent: Jun. 27, 2017

(54) METHOD OF MAKING PHOTONIC CRYSTAL

(71) Applicant: NATIONAL CHUNG SHAN INSTITUTE OF SCIENCE AND TECHNOLOGY, Taoyuan (TW)

(72) Inventors: Ta-Ching Li, Taoyuan (TW); Dai-Liang Ma, Taoyuan (TW); Bang-Ying Yu, Taoyuan (TW); Bo-Cheng Lin, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 64 days.

(21) Appl. No.: 14/961,963

(22) Filed: Dec. 8, 2015

(51) Int. Cl.
*C30B 23/04* (2006.01)
*C30B 23/02* (2006.01)
*C30B 23/00* (2006.01)
*C30B 29/36* (2006.01)

(52) U.S. Cl.
CPC .......... *C30B 23/025* (2013.01); *C30B 23/005* (2013.01); *C30B 29/36* (2013.01)

(58) Field of Classification Search
CPC .......... C30B 23/00; C30B 23/04; C30B 23/02; C30B 29/16
See application file for complete search history.

(56) References Cited

U.S. PATENT DOCUMENTS

| | | | | |
|---|---|---|---|---|
| 6,991,847 B2* | 1/2006 | Padmanabhan | ........ | B82Y 20/00 216/56 |
| 7,060,587 B2* | 6/2006 | Bearda | .......... | B81B 1/002 257/E21.034 |
| 2003/0106487 A1* | 6/2003 | Huang | ............ | C30B 5/00 117/68 |
| 2011/0104535 A1* | 5/2011 | Arsenault | .......... | H01M 6/5044 429/93 |
| 2011/0233476 A1* | 9/2011 | Arsenault | ............ | C09D 5/24 252/500 |
| 2013/0149844 A1* | 6/2013 | Kim | ............ | H01L 21/0237 438/478 |

* cited by examiner

*Primary Examiner* — Robert M Kunemund
(74) *Attorney, Agent, or Firm* — Schmeiser, Olsen & Watts, LLP

(57) ABSTRACT

A method of making a photonic crystal includes step 1 providing a seed, followed by etching a surface of the seed to form thereon submicron voids; step 2 providing a graphite disk, followed by coating a side of the graphite disk with a graphite adhesive whereby the void-formed surface of the seed is attached to the graphite disk to form a seed holder; step 3 placing the seed holder above a growth chamber, followed by placing a raw material below the growth chamber; step 4 forming a thermal field in the growth chamber with a heating device to sublime the raw material; and step 5 controlling temperature, thermal field, atmosphere and pressure in the growth chamber to allow the gaseous raw material to be conveyed and deposited on the seed, thereby forming a photonic crystal.

10 Claims, 4 Drawing Sheets

METHOD OF MAKING PHOTONIC CRYSTAL

FIELD TECHNOLOGY

The present invention relates to methods of making a photonic crystal and more particularly to a method of making a photonic crystal having submicron voids.

BACKGROUND

Conventional growth of crystals from silicon carbide is achieved by Physical Vapor Transport (PVT) and Physical Vapor Deposition (PVD) which are also applicable to mass production of chips. For example, U.S. Pat. No. 5,746,827 discloses a method of growing large-size crystals from silicon carbide by PVT.

Furthermore, a photonic crystal exhibits periodic changes in material refractive index or dielectric constant in two-dimensional or three-dimensional space to simulate arrangement of atoms in a solid-state crystal. Hence, as regards related prior art, Taiwan patents 1318418 and U.S. Pat. No. 8,384,988 disclose growing a crystal in a two-dimensional manner to build a three-dimensional structure at the expense of restricting the photonic crystal to two-dimensional transmission. Due to the difficulty in a manufacturing process, three-dimensional photonic crystals lag behind two-dimensional photonic crystals in terms of technological advancement. There are few research conducted on three-dimensional crystal manufacturing techniques in Taiwan and the United States, because the prior art renders it difficult to deposit different types of atoms alternately to form multilayer structure. For instance, U.S. Pat. No. 8,384,988 discloses controlling the deposition of atoms in electrochemical and voltage-driven manner. Both U.S. Pat. No. 8,309,113 and U.S. Pat. No. 7,799,378 disclose that substance or polymeric material micoparticles, which can be etched and removed, serve as the fillers between different media to undergo a multilayer stacking process and eventually form a three-dimensional structure. Both U.S. Pat. No. 7,990,611 and U.S. Pat. No. 7,919,216 disclose making photonic crystals by an optical means. U.S. Pat. No. 7,990,611 discloses bringing about an interference pattern by laser-based optical diffraction to thereby produce a periodic structure required for photonic crystals. U.S. Pat. No. 7,919,216 discloses effectuating a periodic structure having the same photonic crystal as a mask. As indicated above, photonic crystal materials are manufactured by an electrochemical means, etching, optical exposure and development, and a semiconductor process, that is, a simple process characterized by easy processing and etching, thereby imposing limitations upon the choice of materials which photonic crystals are made from.

SUMMARY

A photonic crystal contains therein different media periodically arranged. For example, assuming that a photonic crystal contains therein a first medium and a second medium which are periodically arranged, wherein the first medium has a high refractive index n1, and the second medium has a high refractive index n2, with the two media having a refractive index ratio of n1/n2, the larger the ratio, the larger the refractive index difference between the two media, and in consequence the larger the photonic band gap of the photonic crystal.

Photonic crystals are commonly made from materials as follows: silicon dioxide, with a refractive index (n) of 1.45; and zinc oxide, with a refractive index (n) of 2.0, Compared with silicon dioxide and zinc oxide, wide-bandgap materials has a high refractive index. For example, silicon carbide has a refractive index (n) of 2.65, aluminum nitride has a refractive index (n) of 2.15, and gallium nitride has a refractive index (n) of 2.4.

In the situation where air, whose refractive index (n) also approximates to 1, serves as the second medium with a low refractive index, the larger the refractive index of the first medium, the larger the refractive index difference of the photonic crystal, and thus the larger the photonic band gap. Using a wide-bandgap material with a high refractive index as the first medium is effective in increasing the refractive index difference between two media to thereby obtain a photonic crystal with a large photonic band gap.

Hence, it is necessary to provide a method of making a photonic crystal from a wide-bandgap material to increase the refractive index difference between two media of a photonic crystal.

To overcome the aforesaid drawback of the prior art, the present invention provides a method of making a photonic crystal. The method comprises:

step 1: providing a seed, followed by etching a surface of the seed to form thereon submicron voids;

step 2: providing a graphite disk, followed by coating a side of the graphite disk with a graphite adhesive whereby the void-formed surface of the seed is attached to the graphite disk to form a seed holder;

step 3: placing the seed holder above a growth chamber, followed by placing a raw material below the growth chamber;

step 4: forming a thermal field in the growth chamber with a heating device to sublime the raw material by controlling the thermal field in a manner to position the seed holder at a relatively cool end of the thermal field and position the raw material at a relatively hot end of the thermal field; and step 5: controlling temperature, thermal field, atmosphere and pressure in the growth chamber to allow the gaseous raw material to be conveyed and deposited on the seed, thereby forming a photonic crystal.

In step 5, the submicron voids are subjected to a locally high temperature such that crystals at the bottom of the submicron voids sublime to thereby produce gas molecules, thereby increasing the depth of the submicron voids; afterward, the gas molecules in the submicron voids crystallizes on the surface of the graphite adhesive to thereby seal the submicron voids hermetically, thereby finalizing the formation of the submicron voids.

Regarding the method, steps 1-5 are repeated to use the photonic crystal made in preceding steps 1-5 as a seed and thus form a photonic crystal having multiple layers of submicron voids.

Regarding the method, the seed and the raw material are wide-bandgap materials.

Regarding the method, the wide-bandgap material is silicon carbide, gallium nitride or aluminum nitride.

Regarding the method, wherein the wide-bandgap material is silicon carbide.

Regarding the method, wherein the silicon carbide has a silicon surface.

Regarding the method, the submicron voids formed by etching performed in step 1 have a depth of at least 500 μm.

Regarding the method, wherein the graphite adhesive further comprises a doping element which, in step 5, evaporates and spreads to the submicron voids to deposit in the submicron voids such that the doping element is eventually enclosed in the submicron voids.

Regarding the method, wherein the doping element is carbon.

Regarding the method, wherein the doping element is a metallic element.

The present invention is characterized in that a wide-bandgap monocrystalline crystal is grown from a seed with a surface having submicron voids by a Physical Vapor Transport (PVT) system such that air or a specific metallic element is periodically enclosed in the wide-bandgap crystal to form a photonic crystal.

A method of making a photonic crystal according to the present invention is characterized in that: the photonic crystal is made from a seed with a surface having submicron voids to create a temperature gradient difference such that crystals at the bottom of the submicron voids sublime, thereby increasing the depth of the submicron voids; afterward, the gaseous molecules in the submicron voids crystallize on the surface of the graphite adhesive such that the seed encloses a doping element or forms voids gradually in the course of crystal growth, thereby finalizing the formation of a two-dimensional or even three-dimensional photonic crystal.

Compared with the prior art, the present invention provides a method of making a photonic crystal so as to make the photonic crystal from a wide-bandgap material. With the wide-bandgap material having a high refractive index, the photonic crystal thus made has a large photonic band gap.

BRIEF DESCRIPTION

Objectives, features, and advantages of the present invention are hereunder illustrated with specific embodiments in conjunction with the accompanying drawings, in which.

DETAILED DESCRIPTION

Embodiment 1

Embodiment 1 is implemented by following the steps below to make a photonic crystal having a single layer of submicron voids.

Step 1: providing a seed, followed by etching a surface of the seed to form thereon submicron voids.

In embodiment 1, the seed is silicon carbide, but the present invention is not limited thereto. The seed can also be any other wide-bandgap material, such as aluminum nitride or gallium nitride. Preferably, the seed has a silicon surface whenever silicon carbide serves as the seed.

In step 1, a surface of the seed is etched to thereby take on a submicron pattern formed from submicron voids.

In step 1, the submicron voids have a depth of 500 μm, but the present invention is not limited thereto. Preferably, the submicron voids have a depth of 500 μm or more.

Step 2: providing a graphite disk, followed by coating one side of the graphite disk with a graphite adhesive whereby the void-formed surface of the seed is attached to the graphite disk to form a seed holder.

Figure 1:
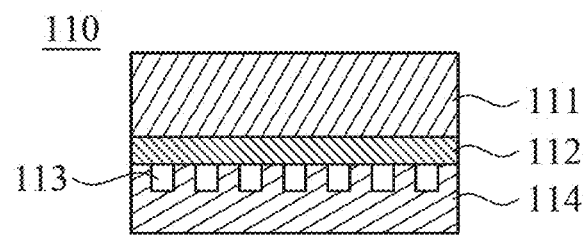
FIG. 1 is a schematic view of a seed holder according to embodiment 1 of the present invention.

Referring to FIG. 1, a seed holder 110 made with step 2 comprises: a graphite disk 111; a graphite adhesive 112 coated on one surface of the graphite disk 111; and a seed 114 with one surface having submicron voids 113, wherein the submicron voids 113 are disposed between the graphite adhesive 112 and the seed 114.

Step 3: placing the seed holder above a growth chamber, followed by placing a raw material below the growth chamber.

Figure 2:
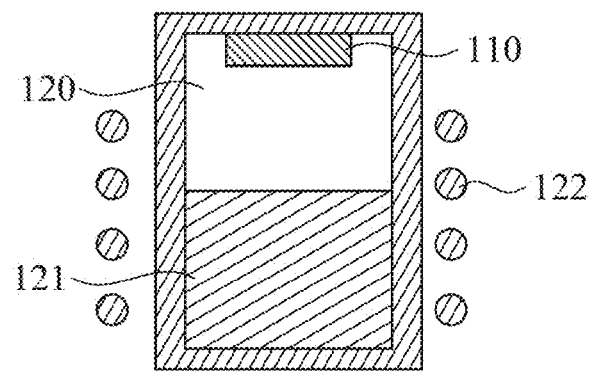
FIG. 2 is a schematic view of a growth chamber according to embodiment 1 of the present invention.

Referring to FIG. 2, the seed holder 110 is disposed above a growth chamber 120, and the raw material 121 is disposed below the growth chamber 120. A heating device 122 is positioned in the vicinity of the growth chamber 120. In the subsequent steps, the heating device 122 creates a thermal field inside the growth chamber 120.

In embodiment 1, the raw material is silicon carbide, but the present invention is not limited thereto. The raw material can also be any other wide-bandgap material, such as aluminum nitride or gallium nitride.

Step 4: forming a thermal field in the growth chamber with a heating device to sublime the raw material by controlling the thermal field in a manner to position the seed holder at a relatively cool end of the thermal field and position the raw material at a relatively hot end of the thermal field.

Step 5: controlling temperature, thermal field, atmosphere and pressure in the growth chamber to allow the gaseous raw material to be conveyed and deposited on the seed, thereby forming a photonic crystal. In step 5, the submicron voids are subjected to a locally high temperature such that crystals at the bottom of the submicron voids sublime, thereby increasing the depth of the submicron voids; afterward, the gaseous molecules in the submicron voids crystallize on the surface of the graphite adhesive to thereby seal the submicron voids hermetically, thereby finalizing the formation of the submicron voids.

Figure 3:
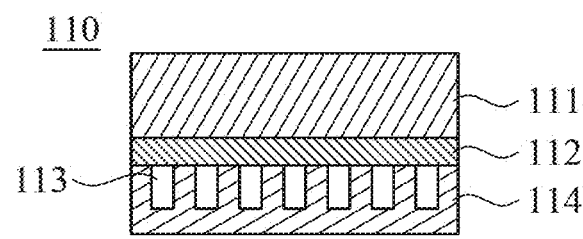
FIG. 3 is a schematic view of how to perform step 5 on a photonic crystal according to embodiment 1 of the present invention.

Referring to FIG. 3, in step 5, the submicron voids 113 are subjected to a locally high temperature such that crystals at the bottom of the submicron voids sublime, thereby increasing the depth of the submicron voids 113.

Figure 4:
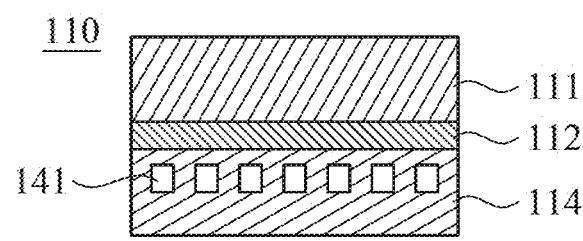
FIG. 4 is a schematic view of how to perform step 5 on a photonic crystal according to embodiment 1 of the present invention.

Referring to FIG. 4, the gaseous molecules in the submicron voids crystallize on the surface of the graphite adhesive 112 to seal the submicron voids hermetically, thereby finalizing the formation of the submicron voids 141.

In embodiment 1, the growth chamber has a temperature of 2100-2200° C., atmosphere of Ar/$N_2$, and pressure of 1-5 torr, but the present invention is not limited thereto. Persons skilled in the art understand that the temperature, thermal field, atmosphere and pressure in the growth chamber can be kept within an appropriate range according to the seed in use, the raw materials which the seed is made from, and the intended deposition rate.

Embodiment 2

In embodiment 2, a photonic crystal with two layers of submicron voids is made by following the steps below.

Step 1: a photonic crystal made in embodiment 1 is provided to serve as a seed, and then one surface of the seed is etched to form a seed with a surface having submicron voids.

In embodiment 2, the seed is silicon carbide, but the present invention is not limited thereto. The seed can also be any other wide-bandgap material, such as aluminum nitride or gallium nitride. In the situation where silicon carbide is used as a seed, the seed has a silicon surface, preferably.

In step 1, a surface of the seed is etched to thereby take on a submicron pattern formed from submicron voids.

In step 1, the submicron voids have a depth of 500 µm, but the present invention is not limited thereto. Preferably, the submicron voids have a depth of 500 µm or more.

Step 2: providing a graphite disk, followed by coating one side of the graphite disk with a graphite adhesive whereby the void-formed surface of the seed is attached to the graphite disk by the graphite adhesive to form a seed holder.

Figure 5:
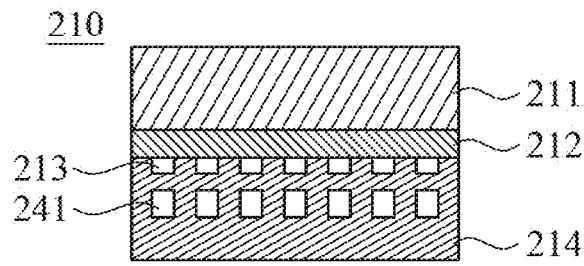
FIG. 5 is a schematic view of a seed holder according to embodiment 2 of the present invention.

Referring to FIG. 5, the seed holder 210 made in step 2 comprises: a graphite disk 211; a graphite adhesive 212 coated on one side of the graphite disk 211; and a seed 214 with a surface having submicron voids 213 and having therein first layer submicron voids 241, wherein the submicron voids 213 are disposed between the graphite adhesive 212 and the seed 214.

Step 3: placing the seed holder above a growth chamber, followed by placing a raw material below the growth chamber.

Embodiment 2 has the same growth chamber, seed holder in the growth chamber, and raw materials as embodiment 1.

In embodiment 2, the raw material is silicon carbide, but the present invention is not limited thereto. The raw material can also be any other wide-bandgap material, such as aluminum nitride or gallium nitride.

Step 4: forming a thermal field in the growth chamber with a heating device to sublime the raw material by controlling the thermal field in a manner to position the seed holder at a relatively cool end of the thermal field and position the raw material at a relatively hot end of the thermal field.

Step 5: controlling temperature, thermal field, atmosphere and pressure in the growth chamber to allow the gaseous raw material to be conveyed and deposited on the seed, thereby forming a photonic crystal. In step 5, the submicron voids are subjected to a locally high temperature such that crystals at the bottom of the submicron voids sublime, thereby increasing the depth of the submicron voids; afterward, the gaseous molecules in the submicron voids crystallize on the surface of the graphite adhesive to thereby seal the submicron voids hermetically, thereby finalizing the formation of second layer submicron voids.

Figure 6:
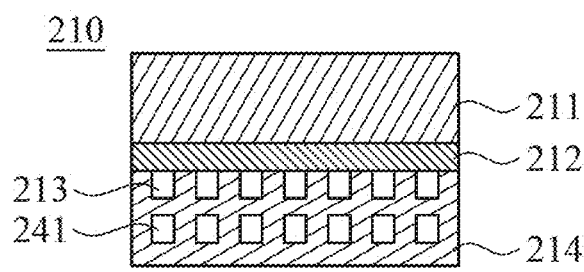
FIG. 6 is a schematic view of how to perform step 5 on a photonic crystal according to embodiment 2 of the present invention.

Referring to FIG. 6, in step 5, the submicron voids 213 are subjected to a locally high temperature such that crystals at the bottom of the submicron voids sublime, thereby increasing the depth of the submicron voids 213.

Figure 7:
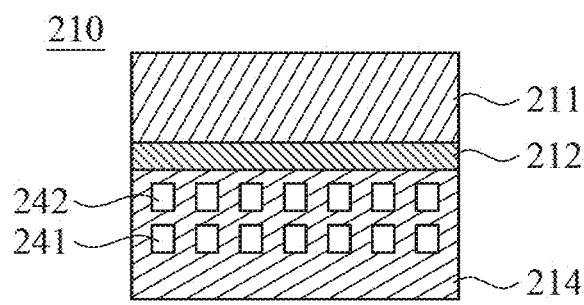
FIG. 7 is a schematic view of how to perform step 5 on a photonic crystal according to embodiment 2 of the present invention.

Referring to FIG. 7, afterward, the gaseous molecules in the submicron voids crystallize on the surface of the graphite adhesive 212 to thereby seal the submicron voids hermetically, thereby forming second layer submicron voids 242.

In embodiment 2, the growth chamber has a temperature of 2100-2200° C., atmosphere of Ar/$N_2$, and pressure of 1-5 torr, but the present invention is not limited thereto. Persons skilled in the art understand that the temperature, thermal field, atmosphere and pressure in the growth chamber can be kept within an appropriate range according to the seed in use, the raw materials which the seed is made from, and the intended deposition rate.

In embodiment 2, the photonic crystal made in embodiment 1 is used as a seed, and then steps 1-5 described in embodiment 1 are repeated to thereby make a photonic crystal having two layers of submicron voids, but the present invention is not limited thereto. Instead, embodiment 2 can further involve repeating steps 1-5 in multiple instances such that the photonic crystal made in the preceding steps 1-5 is used as a seed to form a photonic crystal having multiple layers of submicron voids, thereby attaining a two-dimensional or even three-dimensional photonic crystal structure.

Embodiment 3

In embodiment 3, a photonic crystal with one layer of submicron voids each enclosing a doping element is made by following the steps below.

Step 1: providing a seed, followed by etching a surface of the seed to form thereon submicron voids.

In embodiment 3, the seed is silicon carbide, but the present invention is not limited thereto. The seed can also be made from any other wide-bandgap material, such as aluminum nitride or gallium nitride. In the situation where the seed is made from silicon carbide, the seed has a silicon surface, preferably.

In step 1, a surface of the seed is etched to thereby take on a submicron pattern formed from submicron voids.

In step 1, the submicron voids have a depth of 500 µm, but the present invention is not limited thereto. Preferably, the submicron voids have a depth of 500 µm or more.

Step 2: providing a graphite disk, followed by coating one side of the graphite disk with a graphite adhesive whereby the void-formed surface of the seed is attached to the graphite disk to form a seed holder, wherein the graphite adhesive contains a doping element. Unlike embodiment 1, embodiment 3 is characterized in that the graphite adhesive contains a doping element.

In embodiment 3, the doping element is carbon, but the present invention is not limited thereto. For example, the doping element can also be a metallic element.

Figure 8:
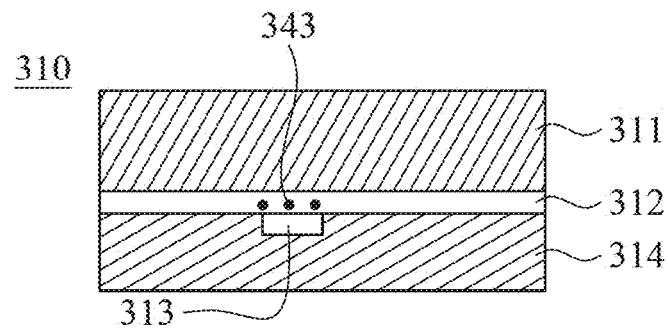
FIG. 8 is a schematic view of a seed holder according to embodiment 3 of the present invention.

Referring to FIG. 8, wherein the seed holder 310 made in step 2 comprises: a graphite disk 311; a graphite adhesive 312 coated on one surface of the graphite disk 311 and comprising a doping element 343; and a seed 314 with a surface having submicron voids 313, wherein the submicron voids 313 are disposed between the graphite adhesive 312 and the seed 314.

Step 3: placing the seed holder above a growth chamber, followed by placing a raw material below the growth chamber.

Embodiment 3 has the same growth chamber, seed holder in the growth chamber, and raw materials as embodiment 1.

In embodiment 3, the raw material is silicon carbide, but the present invention is not limited thereto. The raw material can also be any other wide-bandgap material, such as aluminum nitride or gallium nitride.

Step 4: forming a thermal field in the growth chamber with a heating device to sublime the raw material by controlling the thermal field in a manner to position the seed holder at a relatively cool end of the thermal field and position the raw material at a relatively hot end of the thermal field.

Step 5: controlling temperature, thermal field, atmosphere and pressure in the growth chamber to allow the gaseous raw material to be conveyed and deposited on the seed, thereby forming a photonic crystal. In step 5, the submicron voids are subjected to a locally high temperature such that crystals at the bottom of the submicron voids sublime, thereby increasing the depth of the submicron voids. Then, gaseous molecules in the submicron voids crystallize on the surface of the graphite adhesive to seal the submicron voids hermetically, thereby finalizing the formation of the submicron voids. In step 5, the doping element evaporates and spreads to the submicron voids so as to deposit in the submicron voids such that the doping element is eventually enclosed in the submicron voids.

Figure 9:
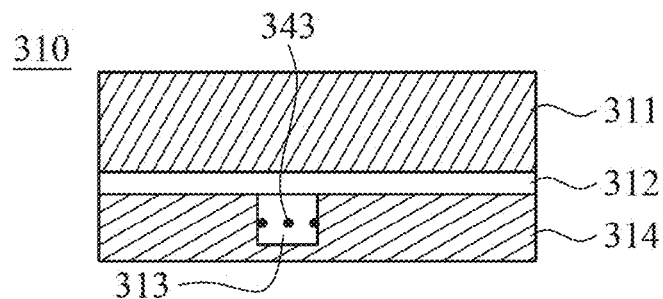
FIG. 9 is a schematic view of how to perform step 5 on a photonic crystal according to embodiment 3 of the present invention.

Referring to FIG. 9, in step 5, the submicron voids 313 are subjected to a locally high temperature such that crystals at the bottom of the submicron voids sublime, thereby increasing the depth of the submicron voids 313. The doping element 343 evaporates and spreads to the submicron voids 313.

Figure 10:
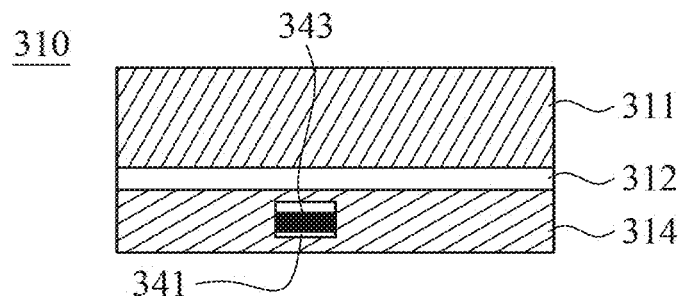
FIG. 10 is a schematic view of how to perform step 5 on a photonic crystal according to embodiment 3 of the present invention.

Referring to FIG. 10, the gaseous molecules in the submicron voids crystallize on the surface of the graphite adhesive 312 to seal the submicron voids hermetically, thereby finalizing the formation of the submicron voids 341, wherein the doping element 343 deposits in the submicron voids and thus is eventually enclosed in the submicron voids 341.

In embodiment 3, the growth chamber has a temperature of 2100-2200° C., atmosphere of $Ar/N_2$ and pressure of 1-5 torr, but the present invention is not limited thereto. Persons skilled in the art understand that the temperature, thermal field, atmosphere and pressure in the growth chamber can be kept within an appropriate range according to the seed in use, the raw materials which the seed is made from, and the intended deposition rate.

In step 5 of the method of making a photonic crystal according to the present invention, with the submicron voids having a lower thermal conductivity than the nearby crystal material, the thermal conductivity of the submicron void-formed surface of the seed varies with the submicron pattern formed from the submicron voids. The submicron voids exhibits unsatisfactory thermal conductivity and thus has a high temperature. In step 5, due to the locally high temperature at the submicron voids, the crystals at the bottoms of submicron voids sublime and thus turn into gaseous molecules, thereby increasing the depth of the submicron voids. Afterward, in the submicron voids, the gas molecules near the graphite adhesive crystallize on the surface of the graphite adhesive as the temperature drops gradually, so as to seal the submicron voids hermetically, thereby finalizing the formation of the submicron voids.

According to the present invention, temperature changes caused by heating the seed with one surface having submicron voids by the thermal field in the growth chamber are analyzed by thermal simulation, and temperature changes caused by heating the seed with one surface lacking submicron voids by the thermal field in the growth chamber are analyzed by thermal simulation as well, so as to provide contrast data for reference.

Figure 11:
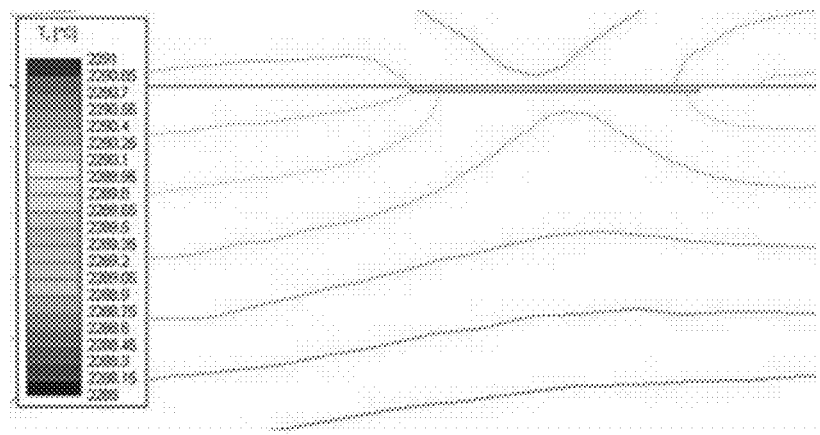
FIG. 11 is a diagram of isotherms on the surface of a seed having submicron voids according to the present invention.

FIG. 11 is a diagram of isotherms on the surface of a seed having submicron voids according to the present invention. FIG. 11 shows that the temperature in the vicinity of the submicron voids is slightly higher than the temperature of the nearby crystal after the seed has been heated up by the thermal field in the growth chamber. Referring to FIG. 11, the higher the isotherms, the more uneven is the distribution of the temperature within the region. This indicates that, in even of periodic submicron voids, significant temperature changes will occur at the junction of the seed and the graphite adhesive. Referring to FIG. 11, in step 5, there is a temperature difference between the submicron void region and the nearby crystal region. The present invention is characterized in that, due to the aforesaid temperature difference, submicron voids can be formed inside the seed in step 5 such that a doping element is enclosed in the submicron voids.

Figure 12:
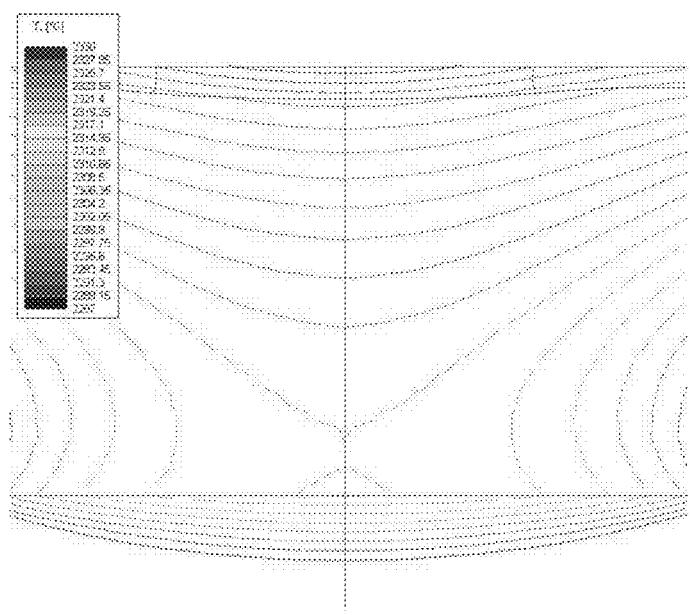
FIG. 12 is a diagram of isotherms on the surface of a seed lacking submicron voids according to the present invention.

FIG. 12 is a diagram of isotherms on the surface of a seed lacking submicron voids according to the present invention. FIG. 12 differs from FIG. 11 in that the isotherms in the vicinity of the seed surface shown in FIG. 12 are more gradual than those shown in FIG. 11, thereby indicating no significant changes in the temperature of the surface of the seed whose surface lacks submicron voids.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A method of making a photonic crystal, the method comprising:
   step 1: providing a seed, followed by etching a surface of the seed to form thereon submicron voids;
   step 2: providing a graphite disk, followed by coating a side of the graphite disk with a graphite adhesive whereby the void-formed surface of the seed is attached to the graphite disk to form a seed holder;
   step 3: placing the seed holder above a growth chamber, followed by placing a raw material below the growth chamber;
   step 4: forming a thermal field in the growth chamber with a heating device to sublime the raw material by controlling the thermal field in a manner to position the seed holder at a relatively cool end of the thermal field and position the raw material at a relatively hot end of the thermal field; and
   step 5: controlling temperature, thermal field, atmosphere and pressure in the growth chamber to allow the gaseous raw material to be conveyed and deposited on the seed, thereby forming a photonic crystal,
   wherein, in step 5, the submicron voids are subjected to a locally high temperature such that crystals at the bottom of the submicron voids sublime, thereby increasing a depth of the submicron voids, and then gas molecules in the submicron voids crystallize on a surface of the graphite adhesive to seal the submicron voids hermetically, thereby finalizing formation of the submicron voids.

2. The method of claim 1, wherein steps 1-5 are repeated to use the photonic crystal made in preceding steps 1-5 as a seed and thus form a photonic crystal having multiple layers of submicron voids.

3. The method of claim 1, wherein the seed and the raw material are wide-bandgap materials.

4. The method of claim 3, wherein the wide-bandgap material is one of silicon carbide, gallium nitride and aluminum nitride.

5. The method of claim 4, wherein the wide-bandgap material is silicon carbide.

6. The method of claim 5, wherein the silicon carbide has a silicon surface.

7. The method of claim 1, wherein the submicron voids formed by etching performed in step 1 have a depth of at least 500 µm.

8. The method of claim 1, wherein the graphite adhesive further comprises a doping element which, in step 5, evaporates and spreads to the submicron voids to deposit in the submicron voids such that the doping element is eventually enclosed in the submicron voids.

9. The method of claim 8, wherein the doping element is carbon.

10. The method of claim 8, wherein the doping element is a metallic element.

* * * * *